(12) United States Patent
Wang et al.

(10) Patent No.: US 7,683,447 B2
(45) Date of Patent: Mar. 23, 2010

(54) MRAM DEVICE WITH CONTINUOUS MTJ TUNNEL LAYERS

(75) Inventors: Yu-Jen Wang, Hsinchu (TW);
Young-Shying Chen, Hsin-Chu (TW);
Ya-Chen Kao, Hsin-Chu (TW);
Chun-Jung Lin, HsinChu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 224 days.

(21) Appl. No.: 11/854,478

(22) Filed: Sep. 12, 2007

(65) Prior Publication Data
US 2009/0065883 A1    Mar. 12, 2009

(51) Int. Cl.
*H01L 29/92*    (2006.01)
(52) U.S. Cl. .................. 257/422; 257/295; 257/296; 257/E27.005
(58) Field of Classification Search .................. 257/295, 257/296, 421, 422, E27.005, E27.006; 365/130–131, 365/158, 173
See application file for complete search history.

(56) References Cited
U.S. PATENT DOCUMENTS
2004/0150015 A1* 8/2004 Tsang ................. 257/293

* cited by examiner

*Primary Examiner*—Thanhha Pham
(74) *Attorney, Agent, or Firm*—K&L Gates LLP

(57) ABSTRACT

A method for fabricating a magnetoresistive random access memory (MRAM) device having a plurality of memory cells includes: forming a fixed magnetic layer having magnetic moments fixed in a predetermined direction; forming a tunnel layer over the fixed magnetic layer; forming a free magnetic layer, having magnetic moments aligned in a direction that is adjustable by applying an electromagnetic field, over the tunnel layer; forming a hard mask on the free magnetic layer partially covering the free magnetic layer; and unmagnetizing portions of the free magnetic layer uncovered by the hard mask for defining one or more magnetic tunnel junction (MTJ) units.

9 Claims, 4 Drawing Sheets

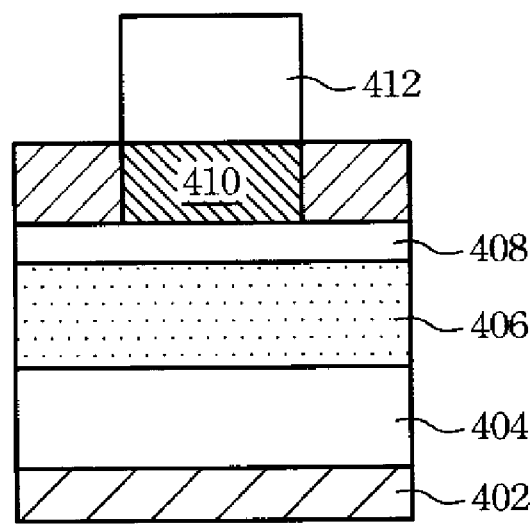
F I G . 7
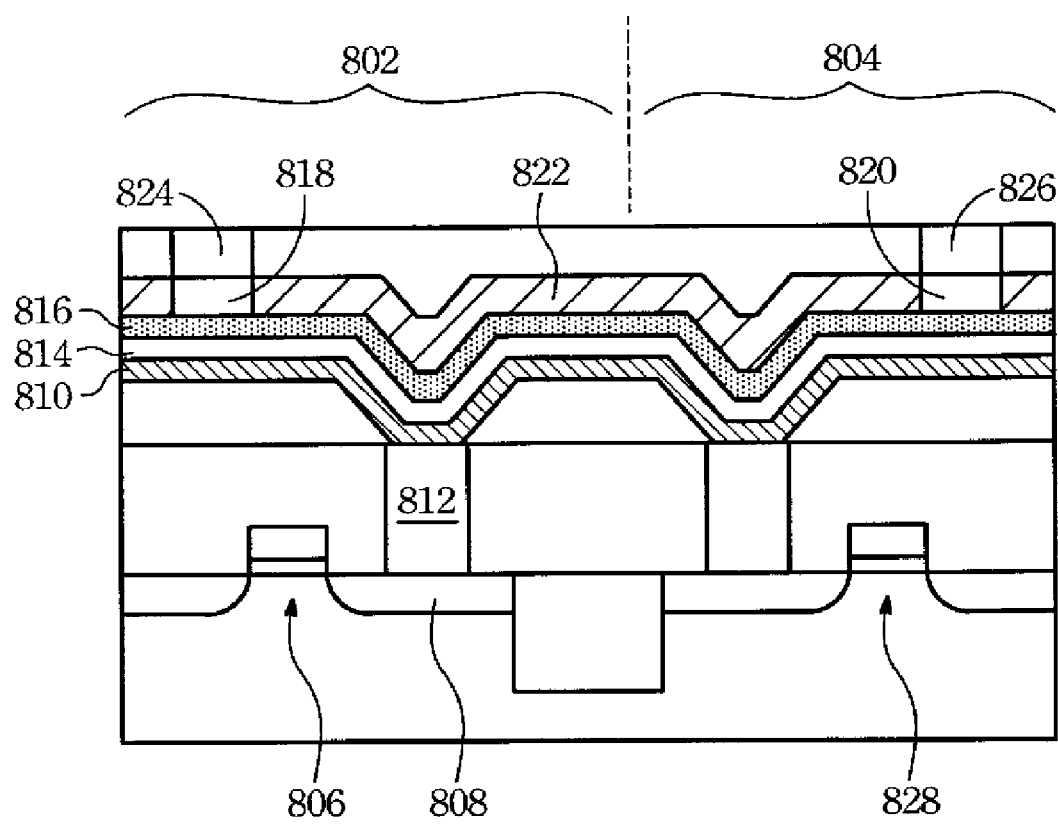
F I G . 8

MRAM DEVICE WITH CONTINUOUS MTJ TUNNEL LAYERS

BACKGROUND

The present invention relates generally to magnetoresistive random access memory (MRAM), and more particularly to MRAM cells having magnetic tunnel junction (MTJ) units with continuous tunnel layers.

MRAM is a type of memory device containing an array of MRAM cells that store data using their resistance values instead of electronic charges. Each MRAM cell includes a magnetic tunnel junction (MTJ) unit whose resistance can be adjusted to represent a logic state "0" or "1." Conventionally, the MTJ unit is comprised of a fixed magnetic layer, a free magnetic layer, and a tunnel layer disposed there between. The resistance of the MTJ unit can be adjusted by changing the direction of the magnetic moment of the free magnetic layer with respect to that of the fixed magnetic layer. When the magnetic moment of the free magnetic layer is parallel to that of the fixed magnetic layer, the resistance of the MTJ unit is low, whereas when the magnetic moment of the free magnetic layer is anti-parallel to that of the fixed magnetic layer, the resistance of the MTJ unit is high. The MTJ unit is coupled between top and bottom electrodes, and an electric current flowing through it from one electrode to another can be detected to determine its resistance, and therefore its logic state.

FIG. 1 illustrates a cross-sectional view of a typical MRAM cell 100 comprised of a MTJ unit 102 coupled to a bit line 104 through a top electrode 106, and to a source/drain doped region 108 of a MOS device 116 through a bottom electrode 110 and a contact 112. A write line 114 is placed underneath the MTJ unit 102 for generating an electromagnetic field to change the resistance of the MTJ unit 102 during write operation. During read operation, the MOS device 116 is selected to pass a current through the bit line 104, the top electrode 106, the MTJ unit 102, the bottom electrode 110, and the contact 112 to its source region 118. The current detected at the bit line 104 is compared with a reference to determine whether the resistance of the MTJ unit 102 represents a high or low state. Because MRAM does not utilize electric charges for data storage, it consumes less power and suffers less from current leakage than other types of memory, such as static random access memory (SRAM), dynamic random access memory (DRAM) and flash memory.

FIGS. 2-4 illustrate cross-sectional views of a MTJ unit in progress during a fabrication process. Referring to FIG. 2, a stack of bottom conductive layer 202, anti-ferromagnetic layer 204, pinned layer 206, tunnel layer 208, free magnetic layer 210 and top conductive layer 212 is formed above a semiconductor substrate (not shown in the figure). The anti-ferromagnetic layer 204 fixes of the magnetic moment of the pinned layer 206 in one direction, whereas the magnetic moment of the free magnetic layer 210 can be changed by applying external electromagnetic forces. A photoresistor layer 214 is formed on the top conductive layer 212 to define a width of the MTJ unit in progress.

An etching processing using the photoresistor layer 214 as a mask is performed to remove parts of the top conductive layer 212 uncovered by the photoresistor layer 214. The photoresistor layer 214 is then stripped after the etching process reaches the top surface of the free magnetic layer 210, rendering a cross-sectional view as shown in FIG. 3.

Another etching process, preferably dry etching, is performed using the top conductive layer 212 as a hard mask to remove the free magnetic layer 210, the tunnel layer 208, the pinned layer 206 and the anti-ferromagnetic layer 204 uncovered by the top conductive layer 212 in order to separate a MTJ unit from its neighboring units. The etching process stops when it reaches the top surface of the bottom conductive layer 202, rendering a cross-sectional view as shown in FIG. 4.

One drawback of the conventional etching process in forming the MTJ unit is that the MTJ unit is susceptible to a reliability issue of short circuit. The etching process is performed in a chamber where plasma is introduced to bombard the surface of the MTJ unit in progress. As a result, there may be residual conductive materials remaining on sidewalls of the completed MTJ unit as shown in FIG. 4. These residual conductive materials may conduct a current between the bottom conductive layer 202 and the top conductive layer 212 bypassing the tunnel layer 208, thereby causing the MTJ unit to fail.

Another drawback of the conventional etching process in forming the MTJ unit is that the top conductive layer 212 and the photoresistor layer 214 need to be thick. The MTJ unit is relatively deep for purposes of etching as it is comprised of layers including the free magnetic layer 210, the tunnel layer 208, the pinned layer 206, and the anti-ferromagnetic layer 204. Because the top conductive layer 212 as a hard mask is consumed during the etching process, it needs to be sufficiently thick to ensure that enough of it will remain on the free magnetic layer 210 after the etching. Likewise, the photoresistor layer 214 needs to be sufficiently thick to ensure that enough of it will remain on the top conductive layer 212 after its etching. This poses a challenge to MRAM fabrication, especially when MRAM continues to shrink in size beyond 45 nm of conductor width.

Yet another drawback of the conventional etching process in forming the MTJ unit is that the top surface of the top conductive layer 212 may become rounded after the etching, thereby increasing the difficulty of forming a contact thereon. During the etching process, the corners of the top conductive layer 212 are etched off faster than other parts. As a result, it may be difficult to properly form a contact on the conductive layer 212, and thus causing reliability issues.

As such, what is needed is a method of fabricating MRAM that addresses the short circuit and mask thickness issues present in the conventional process.

SUMMARY

The present invention is directed to MRAM technology. In one embodiment of the present invention, a method for fabricating a magnetoresistive random access memory (MRAM) device having a plurality of memory cells is proposed. The method includes forming a fixed magnetic layer having magnetic moments fixed in a predetermined direction; forming a tunnel layer over the fixed magnetic layer; forming a free magnetic layer, having magnetic moments aligned in a direction that is adjustable by applying an electromagnetic field, over the tunnel layer; forming a hard mask on the free magnetic layer partially covering the free magnetic layer; and unmagnetizing portions of the free magnetic layer uncovered by the hard mask for defining one or more magnetic tunnel junction (MTJ) units.

The construction and method of operation of the invention, however, together with additional objectives and advantages thereof will be best understood from the following description of specific embodiments when read in connection with the accompanying drawings.

BRIEF DESCRIPTION OF THE DRAWINGS

FIGS. 5-7 illustrate cross-sectional views of a MTJ unit in progress during a fabrication process in accordance with one embodiment of the present invention.

FIG. 8 illustrates a cross-sectional view of two neighboring MRAM cells fabricated in accordance with one embodiment of the present invention.

DESCRIPTION

This disclosure is directed to a method of fabricating a MRAM device that addresses the short circuit and mask thickness issues present in the conventional process. The following merely illustrates various embodiments of the present invention for purposes of explaining the principles thereof. It is understood that those skilled in the art will be able to devise various equivalents that, although not explicitly described herein, embody the principles of this invention.

Figure 1:
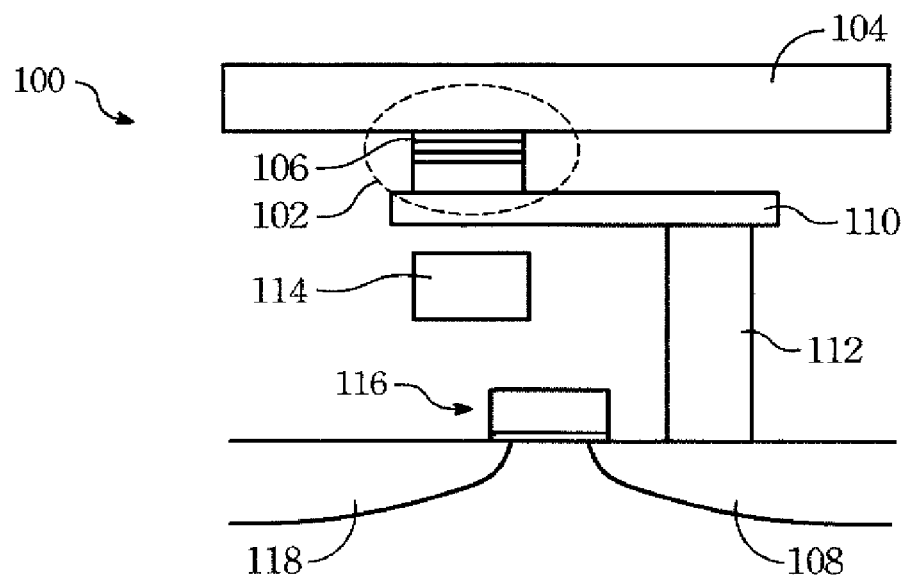
FIG. 1 illustrates a cross-sectional view of a typical MRAM cell.
Figure 2:
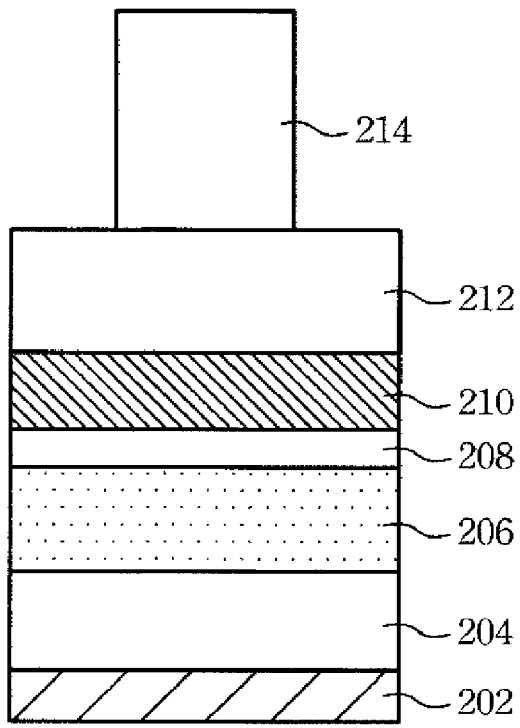
FIGS. 2-4 illustrate cross-sectional views of a MTJ unit in progress during a conventional fabrication process.
Figure 3:
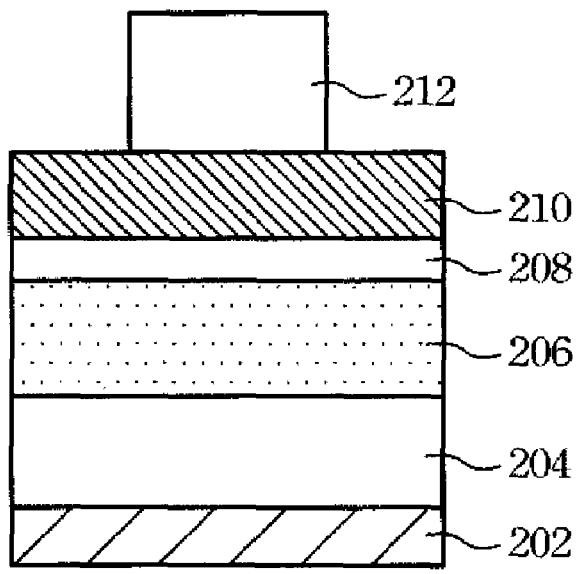
Figure 4:
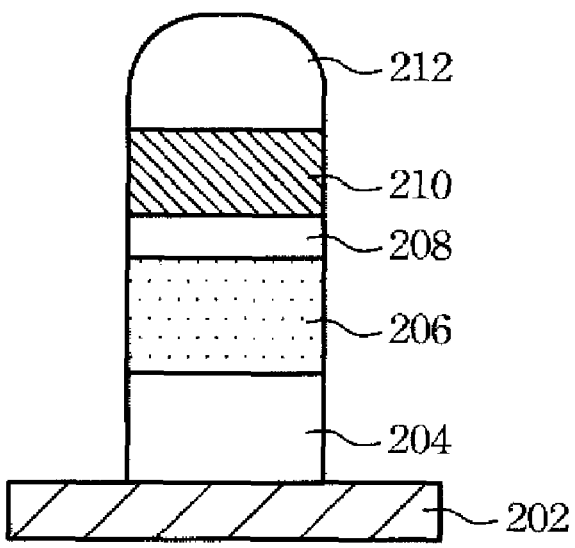
Figure 5:
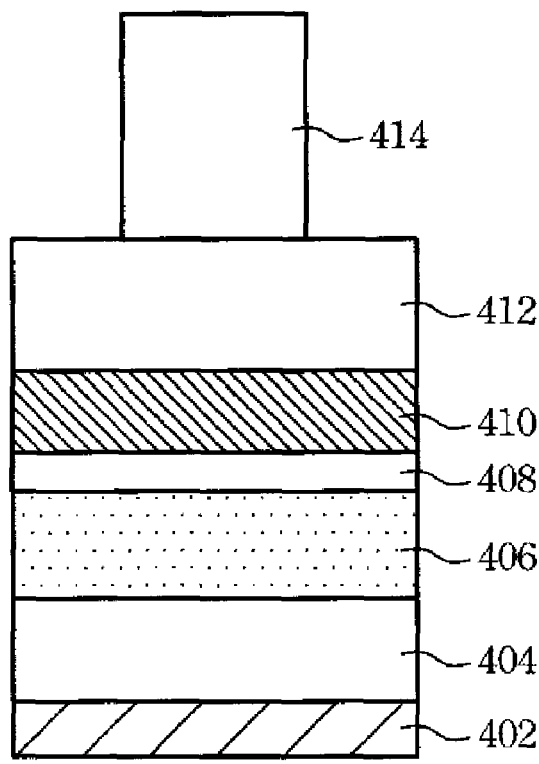
Figure 6:
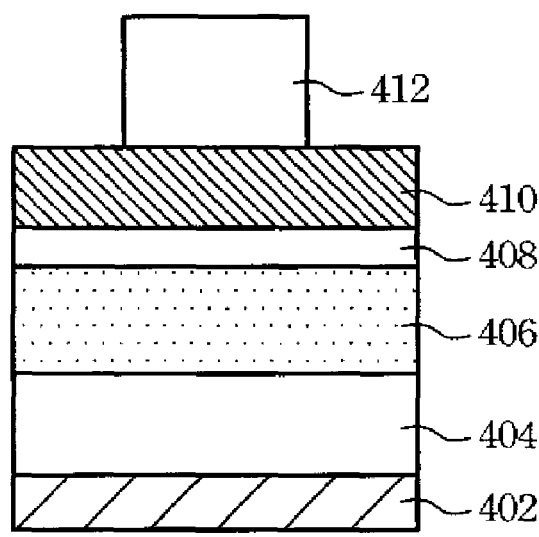

FIGS. 5-7 illustrate cross-sectional views of a MTJ unit in progress during a fabrication process of a MRAM device in accordance with one embodiment of the present invention. Referring to FIG. 5, a stack of bottom conductive layer 402, anti-ferromagnetic layer 404, pinned layer 406, tunnel layer 408, free magnetic layer 410 and top conductive layer 412 is formed above a semiconductor substrate (not shown in the figure). The anti-ferromagnetic layer 404 fixes of the magnetic moment of the pinned layer 406 in one direction, whereas the magnetic moment of the free magnetic layer 410 can be changed by applying external electromagnetic forces. A photoresistor layer 414 is formed on the top conductive layer 412 to define a width of the MTJ unit in progress.

The stack of bottom conductive layer 402, anti-ferromagnetic layer 404, pinned layer 406, tunnel layer 408, free magnetic layer 410 and top conductive layer 412 can be formed by semiconductor processing technology such as chemical vapor deposition (CVD), plasma enhanced chemical vapor deposition (PECVD), sputtering, and electroplating. The top and bottom conductive layers 412 and 402 contain materials, such as tantalum, aluminum, copper, titanium, tungsten, TiN, and TaN. The tunnel layer contains, for example, $Al_2O_3$, MgO, TaOx, and HfO. The photoresistor layer 414 can be formed by photolithography including photoresistor coating, exposing, baking, and developing.

A reactive ion etching is performed using carbon tetrafluoride as reactants to remove portions of the top conductive layer 412 uncovered by the photoresistor layer 414 until the free magnetic layer 410 underlying thereof is exposed. The photoresistor layer 414 is then removed to render a cross-sectional view as shown in FIG. 6.

Referring to FIG. 7, an unmagnetizition process is performed to convert the portions of the free magnetic layer 410 uncovered by the top conductive layer 412 into a structure that does not change its characteristics in response to magnetic fields. For example, an oxidation process can be performed to turn the portions of the free magnetic layer 410 uncovered by the top conductive layer 412 into non-magnetic materials, such as NiFeOx, CoFeOx, NiOx, CoOx and FeOx.

FIG. 8 illustrates a cross-sectional view of two neighboring MRAM cells 802 and 804 fabricated in accordance with one embodiment of the present invention. The first memory cell 802 is comprised of a MOS transistor 806 having a source/drain region 808 coupled to a bottom electrode 810 extending across the first and second memory cells 802 and 804. A fixed magnetic layer 814 comprised of a pinned layer and an anti-ferromagnetic layer (not specifically shown in the figure) overlies the bottom electrode 810. A tunnel layer 816 overlies the fixed magnetic layer 816. Both the fixed magnetic layer 814 and the tunnel layer 816 extend across the first and second memory cells 802 and 804. A first free magnetic layer 818 and a second free magnetic layer 820 are disposed on the tunnel layer 816 in the first and second memory cells 802 and 804, respectively. The first and second free magnetic layers 818 and 820 are separated by a non-magnetized region 822, such that the magnetic moments of the first and second free magnetic layers 818 and 820 can be adjusted independently.

A first top electrode 824 is construction on the first free magnetic layer 818, and a second top electrode 826 is constructed on the second free magnetic layer 820. During read operation where the first memory cell 802 is selected, the MOS transistor 806 is turned on to pass an electric current though the first top electrode 824, the first free magnetic layer 818, the tunnel layer 816, the fixed magnetic layer 814, the bottom electrode 810 and the contact 812 to its source. Since the orientation of the magnetic moment of the first free magnetic layer 818 determines the resistance for the current crossing the tunnel layer 816, the current detected from the first top electrode 824 indicates a logic state of the first memory cell 802. The memory cell 802 can be selected independently from the memory cell 804 by turning on the MOS transistor 806 and off the MOS transistor 806. As a result, the continuous bottom electrode 810, the fixed magnetic layer 814 and the tunnel layer 816 do not affect the reading of the logic state of the memory cell 802.

During write operation of the memory cell 802, a write line (not shown in the figure) adjacent to the first free magnetic layer 818 is raised to a desired voltage level in order to change the orientation of the magnetic moments thereof. Since the first and second free magnetic layers 818 and 820 are separated by the unmagnetized region 822, the programming of one does not affect the other, notwithstanding the continuous bottom electrode 810, the fixed magnetic layer 814 and the tunnel layer 816.

One advantage of the proposed method for fabricating the MRAM devices is that the reliability of the memory structure resulted from such method can be improved as opposed to the structure made by the conventional manufacturing process. As discussed above, the proposed method eliminates the etching process during the construction of MTJ units, and therefore avoids the material residue problem that is often seen on the sidewalls of the MTJ units made by conventional methods. This eliminates the short circuit problems for MTJ units, and therefore improves the reliability of the MRAM devices.

Another advantage of the proposed method is that the MRAM devices made by such method can be easily scaled down as the semiconductor processing technology continues to advance. Since, in the proposed method, the top electrodes 818 and 820 are not utilized as hard masks for etching the free magnetic layer 818, the tunnel layer 816, the fixed magnetic layer 814 and the bottom electrode 810, it can be made much thinner than those made by the conventional methods. For example, the thickness of the top electrode made by the proposed method ranges approximately from 50 A to 800 A, whereas that of the convention is thicker than 200 A. Accordingly, the photoresistor layer for defining the top electrode layers 824 and 820 can be thinner. The proposed method improves the scalability for MRAM devices.

Yet another advantage of the proposed method is to eliminate the rounding effect of the top conductive layer 412, thereby facilitating the process for a contact to be formed thereon. The proposed method does not require the top conductive layer 412 to function as a hard mask for an etching process. As a result, the rounding effect can be minimized, and a flat surface can be produced to facilitate the process of constructing a contact thereon.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A magnetoresistive random access memory (MRAM) device comprising:
    a first memory cell having a first free magnetic layer;
    a second memory cell having a second free magnetic layer separated from the first free magnetic layer by a unmagnetized region;
    a tunnel layer underlying the first free magnetic layer, the unmagnetized region, and the second free magnetic layer, across the first and second memory cells; and
    a fixed layer underlying the tunnel layer for providing the first and second memory cells with magnetic moments fixed in a predetermined direction,
    wherein the first and second free magnetic layers have magnetic moments aligned in directions that can be changed independently by applying an electromagnetic field, thereby adjusting resistance across the tunnel layer for the first or second memory cell.

2. The MRAM device of claim 1 wherein the first and second free magnetic layers contain ferromagnetic materials.

3. The MRAM device of claim 1 wherein the unmagnetized region contains oxidized ferromagnetic materials.

4. The MRAM device of claim 1 wherein the tunnel layer contains materials including, but not being limited to, $Al_2O_3$, MgO, TaOx, and HfO.

5. The MRAM device of claim 1 wherein the fixed magnetic layer contains anti-ferromagnetic materials.

6. The MRAM device of claim 1 wherein the first or second free magnetic layer contains ferromagnetic materials.

7. The MRAM device of claim 1 comprises a first top electrode disposed on the first free magnetic layer, and a second top electrode disposed on the second free magnetic layer.

8. The MRAM device of claim 7 wherein the first and second top electrodes contain materials including, but not being limited to, $Al_2O_3$, MgO, TaOx, and HfO.

9. The MRAM device of claim 7 wherein the first or second top electrode is of a thickness approximately between 50 Å and 800 Å.

* * * * *